United States Patent
Kung et al.

(10) Patent No.: US 12,181,536 B2
(45) Date of Patent: Dec. 31, 2024

(54) TESTING CIRCUIT FOR TESTING UNIVERSAL SERIAL BUS

(71) Applicant: ASMedia Technology Inc., New Taipei (TW)

(72) Inventors: Te-Ming Kung, New Taipei (TW); Yi-Chung Tsai, New Taipei (TW); Shih-Min Lin, New Taipei (TW)

(73) Assignee: ASMedia Technology Inc., New Taipei (TW)

( * ) Notice: Subject to any disclaimer, the term of this patent is extended or adjusted under 35 U.S.C. 154(b) by 144 days.

(21) Appl. No.: 18/178,514

(22) Filed: Mar. 5, 2023

(65) Prior Publication Data
US 2024/0248151 A1 Jul. 25, 2024

(30) Foreign Application Priority Data
Jan. 19, 2023 (TW) .................................. 112102480

(51) Int. Cl.
*G01R 31/66* (2020.01)

(52) U.S. Cl.
CPC .................................... *G01R 31/66* (2020.01)

(58) Field of Classification Search
CPC . G01R 31/66; G01R 31/50; H02J 7/00; G06F 13/4282; G06F 2213/0042
See application file for complete search history.

(56) References Cited

U.S. PATENT DOCUMENTS

| | | | |
|---|---|---|---|
| 2006/0080476 A1* | 4/2006 | Wang | G06F 13/387 710/15 |
| 2013/0300213 A1* | 11/2013 | Zhou | G06F 1/266 307/115 |
| 2015/0303724 A1* | 10/2015 | Lin | H02J 7/00 439/660 |
| 2018/0067885 A1* | 3/2018 | Hsieh | G06F 1/22 |
| 2018/0183248 A1* | 6/2018 | Shen | H02J 7/00306 |
| 2018/0205243 A1* | 7/2018 | Chung | H02J 7/0029 |
| 2019/0079130 A1* | 3/2019 | Ko | G01R 31/50 |
| 2020/0174961 A1* | 6/2020 | Chen | G06F 13/4282 |
| 2021/0367599 A1* | 11/2021 | Sung | H03K 19/09421 |

OTHER PUBLICATIONS

Texas Instruments, "TPS65983B USB Type-C® and USB PD Controller, Power Switch, and High Speed Multiplexer for Thunderbolt 3," Technical data sheet, Aug. 2021, pp. 1-118.

* cited by examiner

*Primary Examiner* — Akm Zakaria
(74) *Attorney, Agent, or Firm* — JCIPRNET

(57) ABSTRACT

A testing circuit for testing a universal serial bus (USB) of an electronic device includes a controller, a first switch, a pull-down resistor, a gating pull-up resistor, and a second switch. The controller provides a control signal according to a power receiving condition of the electronic device. A control terminal of the first switch is coupled to the controller. The pull-down resistor is coupled between a configuration channel pin of the USB and a first terminal of the first switch. The gating pull-up resistor is coupled between the configuration channel pin and the control terminal of the first switch. A control terminal of the second switch is coupled to the controller. A first terminal of the second switch is coupled to a second terminal of the first switch and a ground pin of the USB. A second terminal of the second switch is coupled to a reference low voltage.

10 Claims, 11 Drawing Sheets

TESTING CIRCUIT FOR TESTING UNIVERSAL SERIAL BUS

CROSS-REFERENCE TO RELATED APPLICATION

This application claims the priority benefit of Taiwan application Ser. No. 11/210,2480, filed on Jan. 19, 2023. The entirety of the above-mentioned patent application is hereby incorporated by reference herein and made a part of this specification.

BACKGROUND

Technical Field

The disclosure relates to a testing circuit, and in particular to a testing circuit for testing a universal serial bus of an electronic device.

Description of Related Art

Electronic devices related to the power delivery (PD) of the universal serial bus Type-C (USB-C) need to comply with the compliance test of PD.

FIG. 1 is a schematic diagram of an existing universal serial bus (USB). A USB 10 may execute, for example, the TD 4.1.2 test item in the compliance test. The USB 10 selects a pin from multiple pins other than a configuration channel pin PCC and a ground pin PGND as a pin P_Rd. A pull-down resistor Rd is, for example, coupled between the pin P_Rd and the ground pin PGND. For example, when an electronic device does not receive a power source, the connection between the configuration channel pin PCC and the pin P_Rd is disconnected. Therefore, the resistance value between the configuration channel pin PCC and the ground pin PGND is a high resistance value. When the electronic device receives the power source, the configuration channel pin PCC is connected to the ground pin PGND (as shown by the dotted line). Therefore, the resistance value between the configuration channel pin CC and the ground pin PGND is substantially equal to the resistance value of the pull-down resistor Rd. In this way, the USB 10 is able to conform to the TD 4.1.2 test item.

It should be noted that, in order to execute the TD 4.1.2 test item, the above-mentioned USB 10 has to use an additional pin as the pin P_Rd.

FIG. 2 is a schematic diagram of an existing USB applied to a multiple-port. Once applied to a multi-port, the required number of additional pins P_Rd1 and P_Rd2 increases according to the number of ports. That is, when the number of ports in the multi-port is equal to N, the required number of additional pins is equal to N. Therefore, the multi-port compliance test needs (2N+1) pins for execution. Therefore, the cost of a USB 10' is increased.

SUMMARY

The disclosure provides a testing circuit for testing a universal serial bus Type-C (USB-C). The testing circuit of the disclosure does not need to add an additional pin to execute TD 4.1.2 test item in the USB-C compliance test.

The testing circuit of the disclosure is configured to test a universal serial bus (USB) of an electronic device. The testing circuit includes a controller, a first switch, a pull-down resistor, a gating pull-up resistor, and a second switch. The controller provides a control signal according to a power receiving condition of the electronic device. A control terminal of the first switch is coupled to the controller. The pull-down resistor is coupled between a configuration channel pin of the USB and a first terminal of the first switch. The gating pull-up resistor is coupled between the configuration channel pin and the control terminal of the first switch. A control terminal of the second switch is coupled to the controller. A first terminal of the second switch is coupled to a second terminal of the first switch and a ground pin of the USB. A second terminal of the second switch is coupled to a reference low voltage.

Based on the above, the testing circuit utilizes the configuration channel pin of the USB and the ground pin of the USB to execute the compliance test. In this way, the testing circuit does not need to add an additional pin to execute the compliance test. The pin design cost of the USB is not increased.

In order to make the aforementioned features and advantages of the disclosure comprehensible, embodiments accompanied with drawings are described in detail as follows.

DESCRIPTION OF THE EMBODIMENTS

Figure 1:
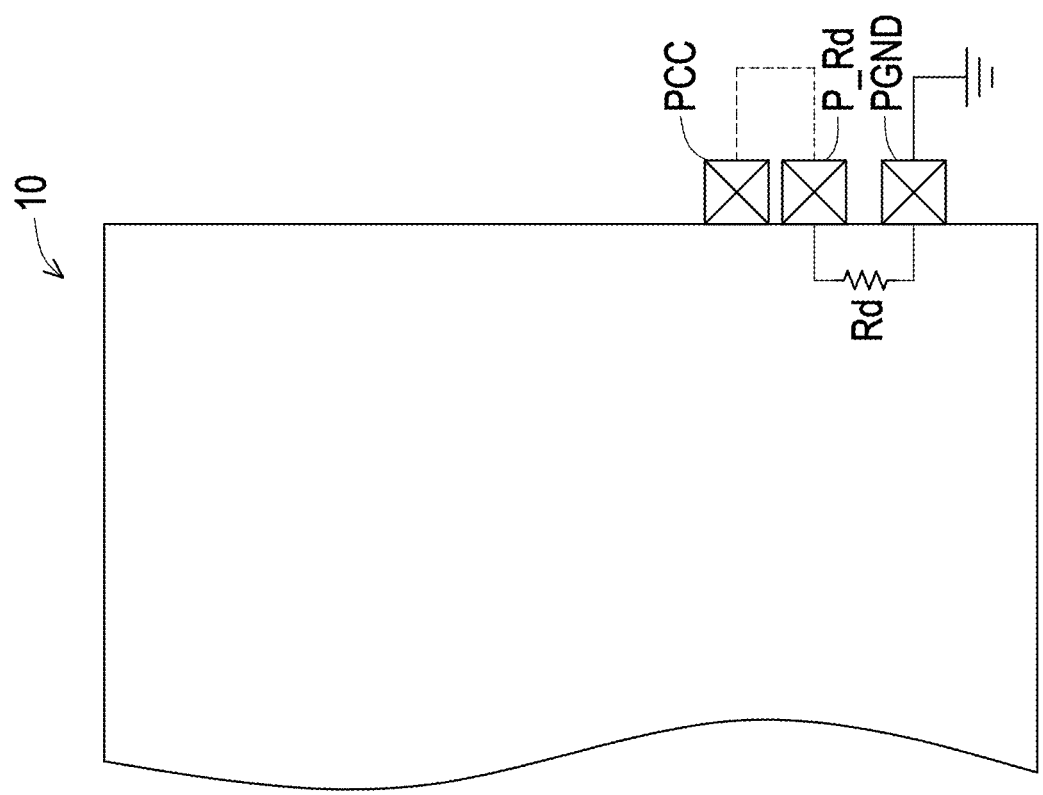
FIG. 1 is a schematic diagram of an existing universal serial bus (USB).
Figure 2:
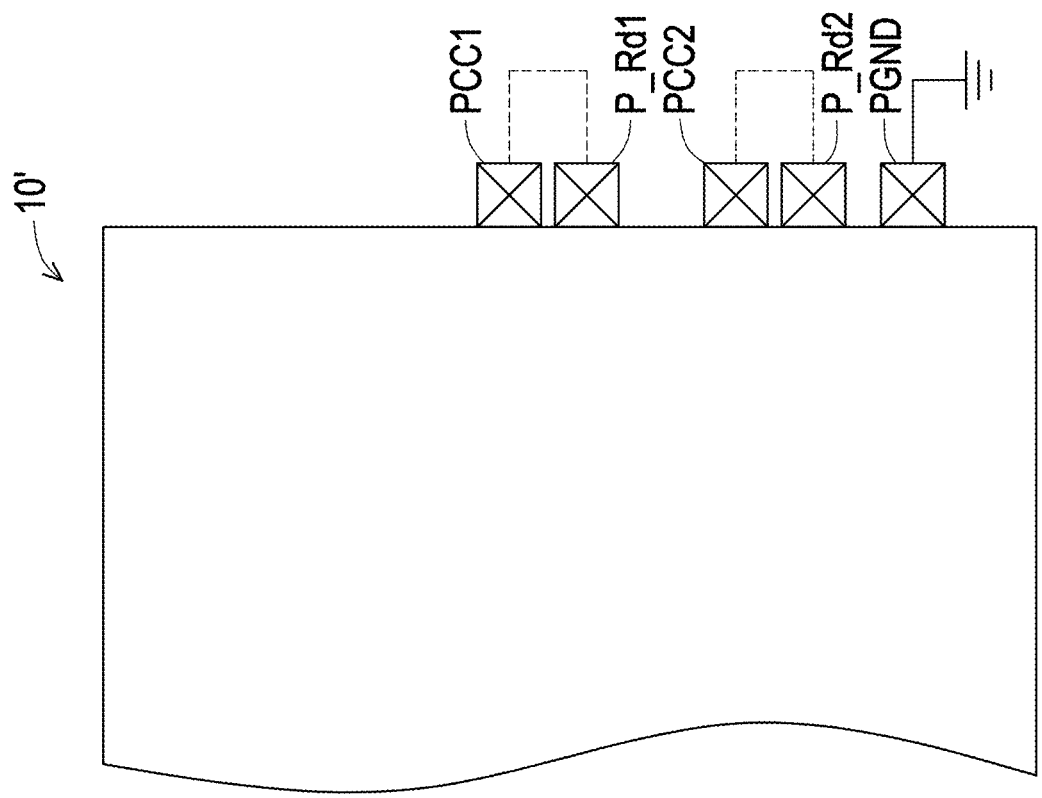
FIG. 2 is a schematic diagram of an existing USB applied to a multiple-port.

Some embodiments of the disclosure accompanied with drawings are described in detail as follows. The reference numerals used in the following description are regarded as the same or similar elements when the same reference numerals appear in different drawings. These embodiments are only a part of the disclosure, and do not disclose all the possible implementations of the disclosure. To be more precise, the embodiments are only examples in the scope of the claims of the disclosure.

Figure 3:
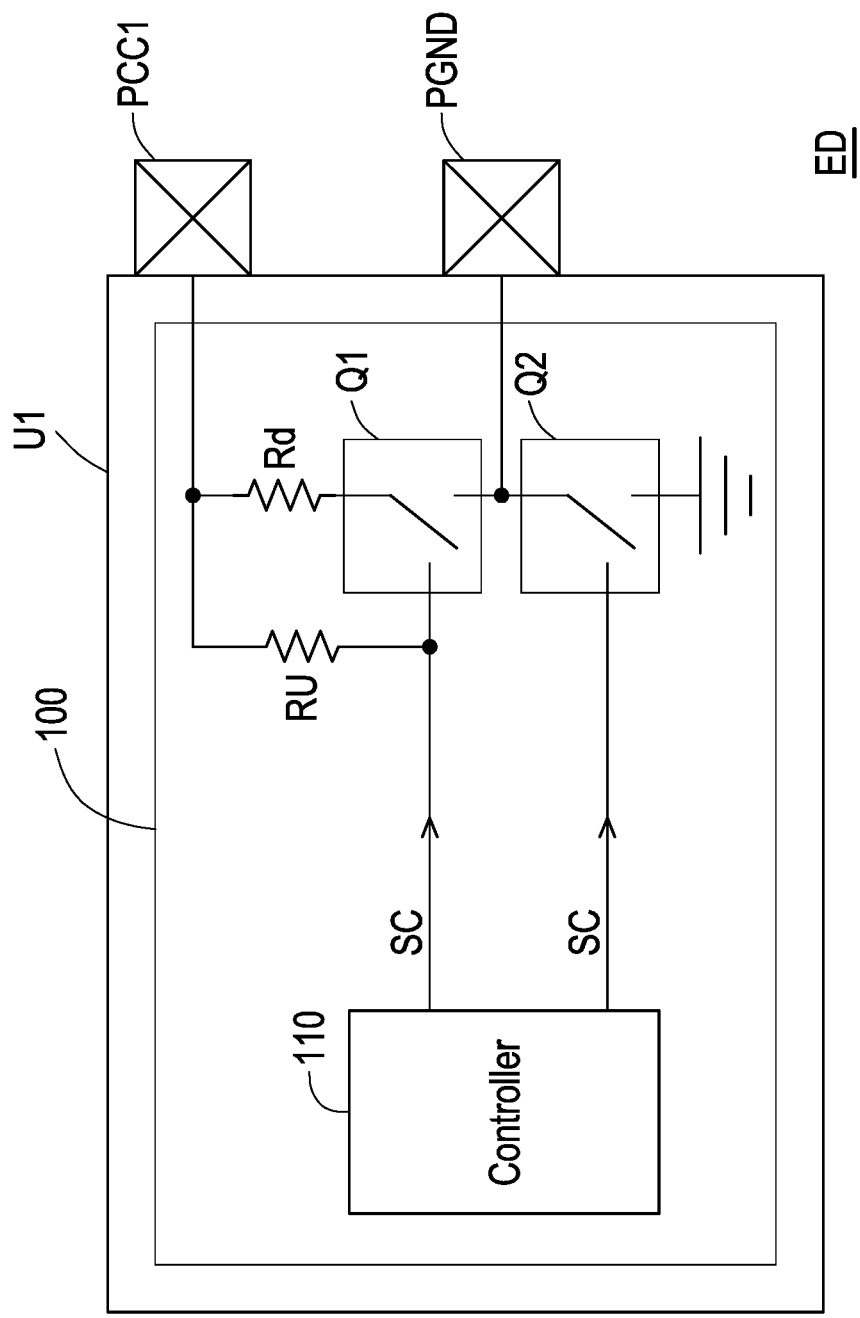
FIG. 3 is a schematic diagram of a testing circuit according to a first embodiment of the disclosure.

Please refer to FIG. 3, which is a schematic diagram of a testing circuit according to a first embodiment of the disclosure. In the embodiment, a testing circuit 100 is configured to test a universal serial bus (USB) U1 of an electronic device ED. In the embodiment, the USB U1 may be a universal serial bus Type-C (USB-C). The electronic device ED may be a desktop computer, a notebook computer, a tablet computer, a smart phone, a portable electronic device or a wearable electronic device.

In the embodiment, the testing circuit 100 is disposed in the electronic device ED or the USB U1. The testing circuit 100 includes a controller 110, switches Q1 and Q2, a pull-down resistor Rd, and a gating pull-up resistor RU. The controller 110 provides a control signal SC according to the power receiving condition of the electronic device ED. A control terminal of the switch Q1 is coupled to the controller 110. The pull-down resistor Rd is coupled between a configuration channel pin PCC1 of the USB U1 and a first terminal of the switch Q1. The gating pull-up resistor RU is coupled between the configuration channel pin PCC1 and the control terminal of the switch Q1. A control terminal of the switch Q2 is coupled to the controller 110. A first terminal of the switch Q2 is coupled to a second terminal of the switch Q1 and a ground pin PGND of the USB U1. A second terminal of the switch Q2 is coupled to a reference low voltage (such as being grounded).

The controller 110 is, for example, a central processing unit (CPU), or other programmable general-purpose or special-purpose microprocessors, digital signal processors (DSPs), programmable controllers, application specific integrated circuits (ASICs), programmable logic devices (PLDs), or other similar devices or a combination of the aforementioned devices, which may load and execute computer programs.

In the embodiment, the testing circuit 100 is adapted for a compliance test of power delivery (PD) of a universal serial bus Type-C (USB-C). For example, the testing circuit 100 is adapted to execute the TD 4.1.2 test item.

It is worth mentioning here that the testing circuit 100 uses the configuration channel pin PCC1 of the USB U1 and the ground pin PGND of the USB U1 to execute the test item. In this way, the testing circuit 100 does not need to add an additional pin to execute the test item.

Next, the implementation details of the compliance test executed by the testing circuit 100 are described in multiple operation modes.

Figure 4:
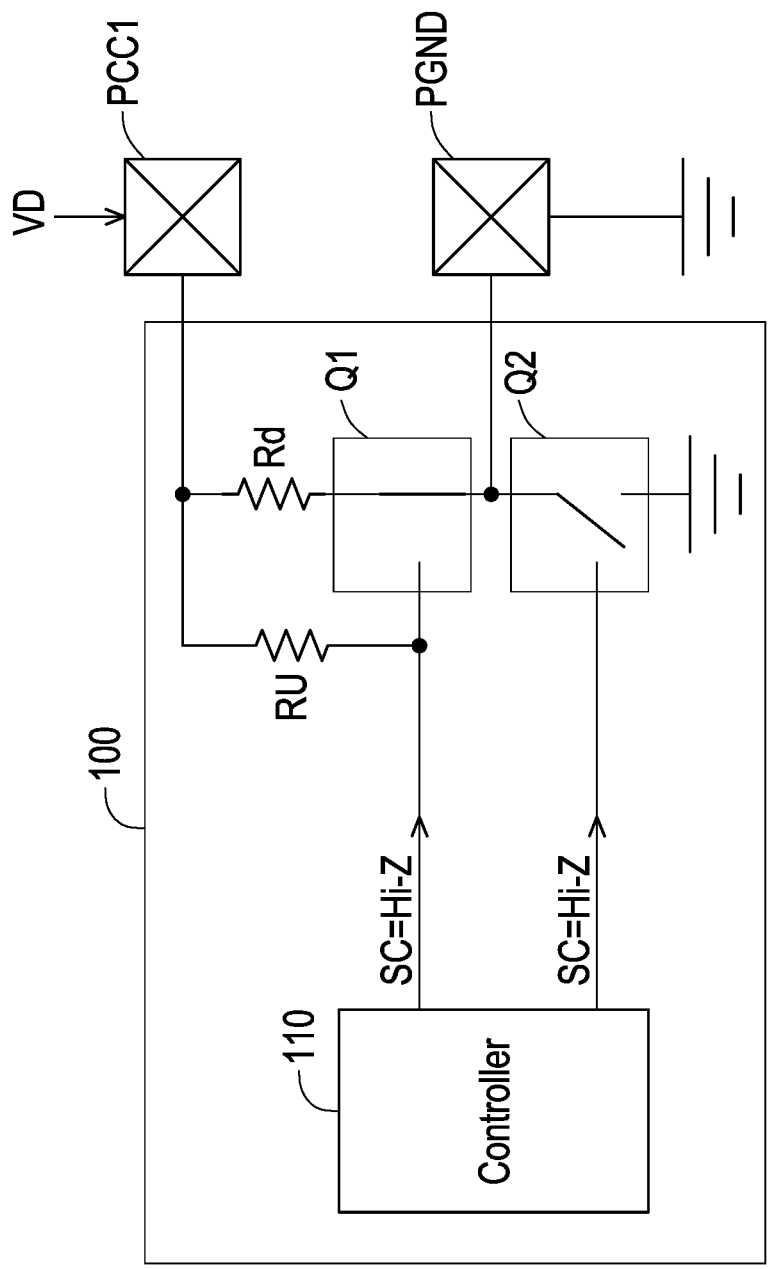
FIG. 4 is a schematic diagram of a first operation mode according to the disclosure.

Please refer to FIG. 4, which is a schematic diagram of a first operation mode according to the disclosure. In the embodiment, in the first operation mode, the electronic device (the electronic device ED shown in FIG. 1) does not receive a power source (not shown). The ground pin PGND is grounded. In the first operation mode, when the electronic device does not receive the power source, the control signal SC is a high impedance (Hi-Z) signal. For example, when the electronic device does not receive the power source, the controller 110 provides a Hi-Z signal or disconnects the controller 110 itself from the control terminal of the switch Q1 and the control terminal of the switch Q2. The control terminal of the switch Q1 and the control terminal of the switch Q2 respectively receive the Hi-Z signals. The configuration channel pin PCC1 receives a test voltage VD. The test voltage VD is transmitted to the control terminal of the switch Q1 through the gating pull-up resistor RU. The switch Q1 is turned on in response to the test voltage VD. Therefore, the resistance value between the configuration channel pin PCC1 and the ground pin PGND is substantially equal to the resistance value of the pull-down resistor Rd (e.g., 5.1 kΩ).

In the embodiment, the switches Q1 and Q2 are transistor switches, respectively. For example, the switches Q1 and Q2 are respectively implemented by N-type field-effect transistors (FETs) or NPN-type bipolar junction transistors (BJTs). The test voltage VD may be a reference high voltage.

In the embodiment, the test voltage VD is, for example, provided by a measuring circuit (not shown). The disclosure is not limited to the supply method of the test voltage VD.

Figure 5:
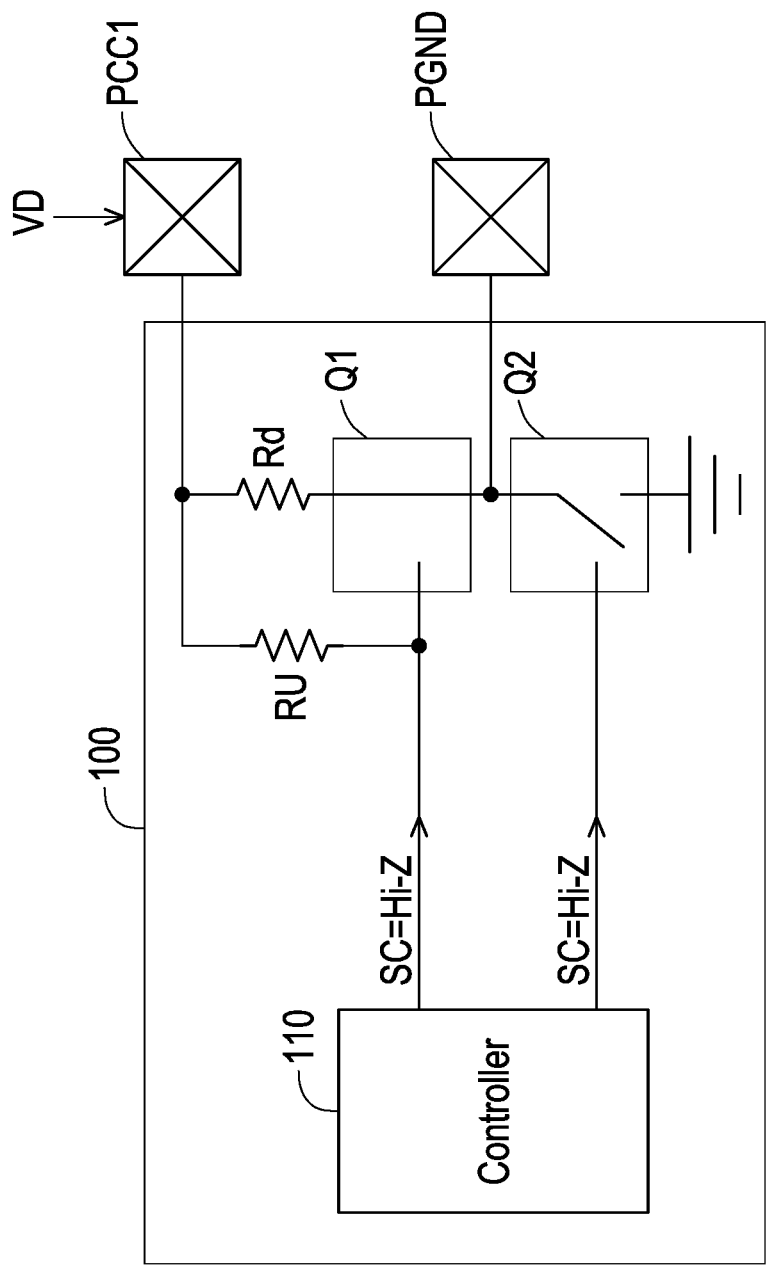
FIG. 5 is a schematic diagram of a second operation mode according to the disclosure.

Please refer to FIG. 5, which is a schematic diagram of a second operation mode according to the disclosure. In the embodiment, in the second operation mode, the electronic device does not receive a power source. The ground pin PGND is floating. In the second operation mode, when the electronic device does not receive the power source, the control signal SC is a high impedance (Hi-Z) signal. The control terminal of the switch Q1 and the control terminal of the switch Q2 respectively receive the Hi-Z signals. The configuration channel pin PCC1 receives the test voltage VD. The test voltage VD is transmitted to the control terminal of the switch Q1 through the gating pull-up resistor RU. Therefore, the switch Q1 is turned on in response to the test voltage VD.

However, the ground pin PGND is floating and the switch Q2 is turned off. Therefore, the resistance value between the configuration channel pin PCC1 and the ground pin PGND is equal to a high impedance value (i.e., Hi-Z).

Figure 6:
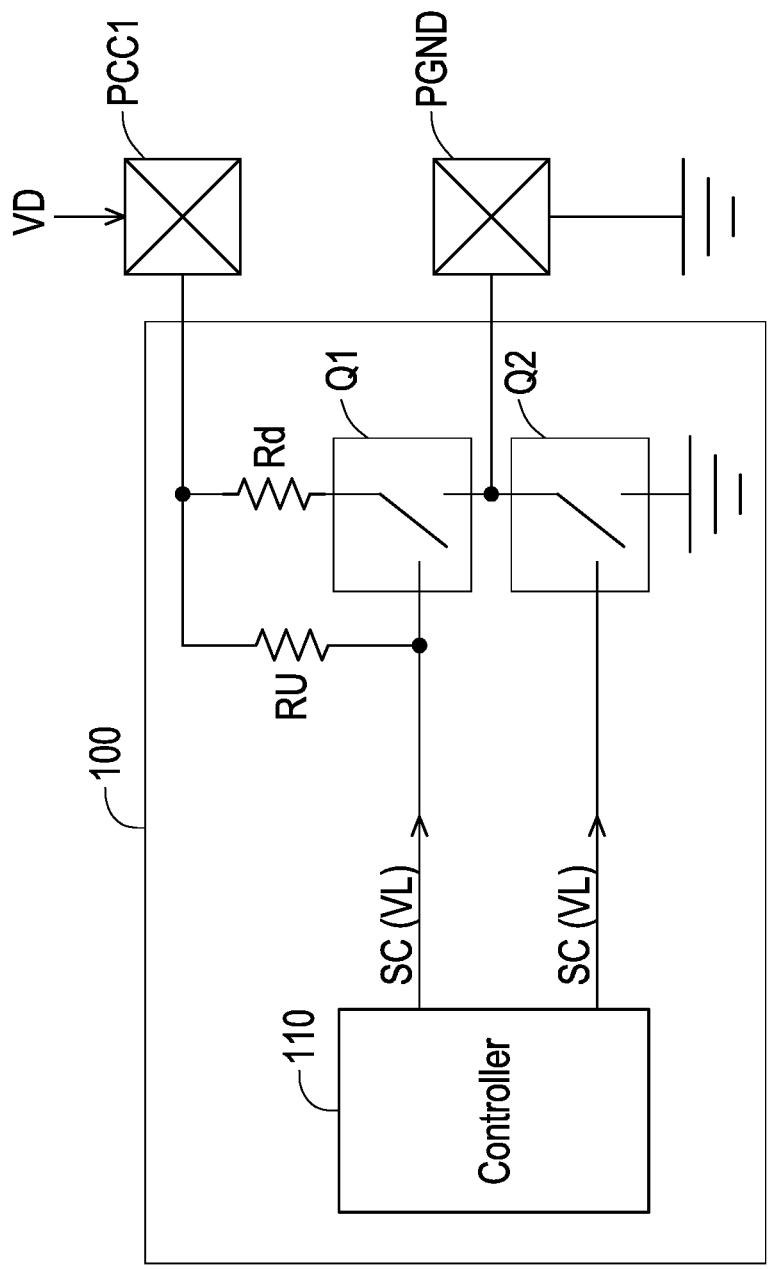
FIG. 6 is a schematic diagram of a third operation mode according to the disclosure.

Please refer to FIG. 6, which is a schematic diagram of a third operation mode according to the disclosure. In the embodiment, in the third operation mode, the electronic device receives a power source. The ground pin PGND is grounded. In the third operation mode, when the electronic device receives the power source, the control signal SC may have a low voltage value VL. The configuration channel pin PCC1 receives the test voltage VD. The switches Q1 and Q2 are turned off in response to the low voltage value VL of the control signal SC. Therefore, the resistance value between the configuration channel pin PCC1 and the ground pin PGND is equal to a high impedance value.

In the third operation mode, when the electronic device does not receive the power source, the control signal SC may have the low voltage value VL. The configuration channel pin PCC1 receives the test voltage VD. The switches Q1 and Q2 are turned off in response to the low voltage value VL of the control signal SC. Therefore, when the electronic device does not receive the power source, the resistance value between the configuration channel pin PCC1 and the ground pin PGND is equal to a high impedance value.

Figure 7:
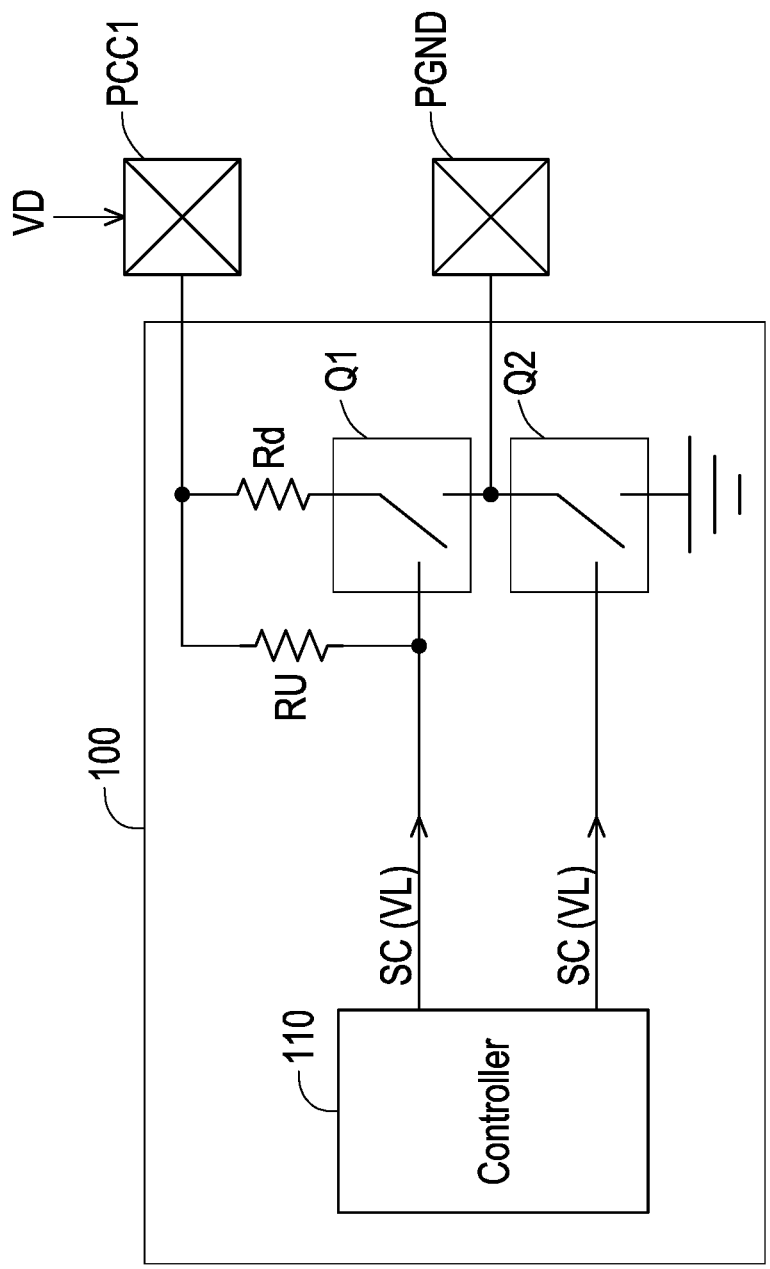
FIG. 7 is a schematic diagram of a fourth operation mode according to the disclosure.

Please refer to FIG. 7, which is a schematic diagram of a fourth operation mode according to the disclosure. In the embodiment, in the fourth operation mode, the electronic device receives a power source. The ground pin PGND is floating. In the fourth operation mode, when the electronic device receives the power source, the control signal SC may have a low voltage value VL. The configuration channel pin PCC1 receives the test voltage VD. The switches Q1 and Q2 are turned off in response to the low voltage value VL of the control signal SC. Therefore, the resistance value between the configuration channel pin PCC1 and the ground pin PGND is equal to a high impedance value.

In the fourth operation mode, when the electronic device does not receive the power source, the control signal SC may have the low voltage value VL. The configuration channel pin PCC1 receives the test voltage VD. The switches Q1 and Q2 are turned off in response to the low voltage value VL of the control signal SC. Therefore, when the electronic device does not receive the power source, the resistance value between the configuration channel pin PCC1 and the ground pin PGND is equal to a high impedance value.

Based on the third operation mode and the fourth operation mode, when the control signal SC has a low voltage value VL, the switches Q1 and Q2 are turned off in response to the low voltage value VL of the control signal SC. This makes the resistance value between the configuration channel pin PCC1 and the ground pin PGND equal to a high impedance value. In an embodiment, the third operation mode and the fourth operation mode are adapted for operation when the electronic device receives a power source. In another embodiment, the third operation mode and the fourth operation mode are adapted for operation when the electronic device does not receive a power source.

Figure 8:
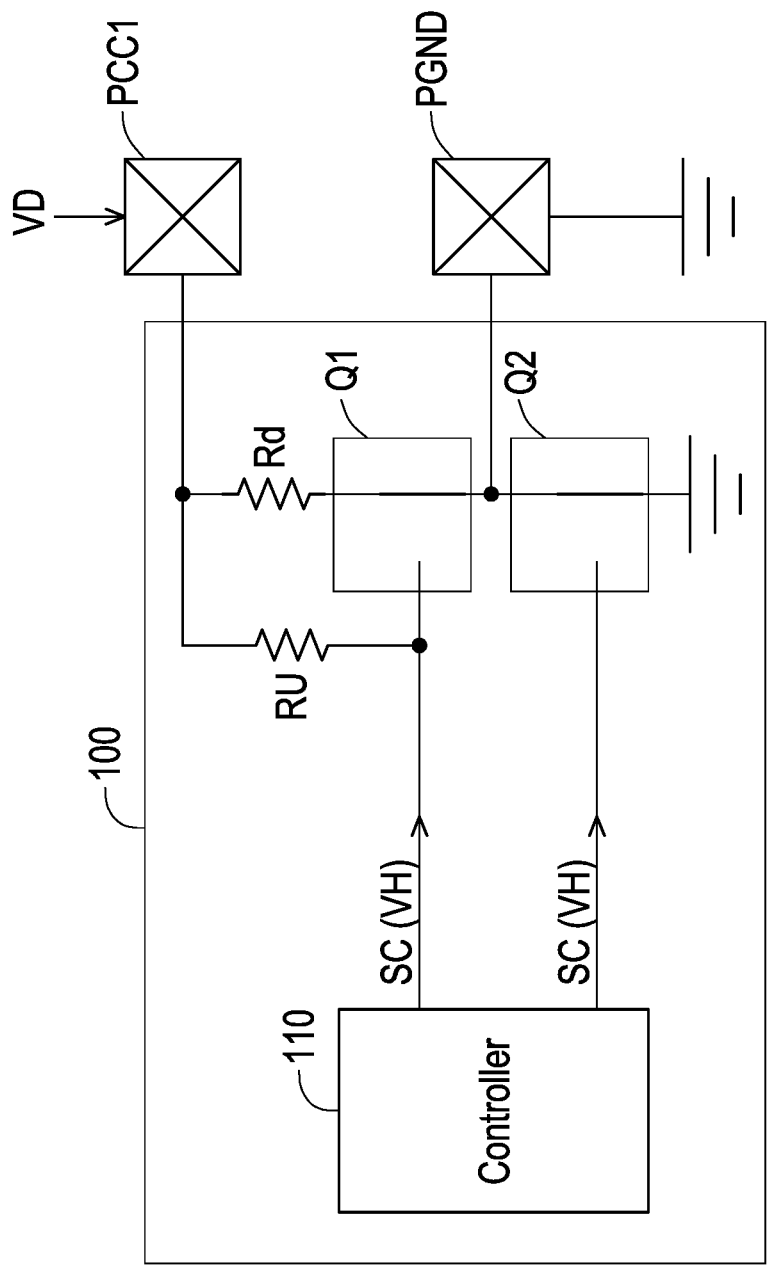
FIG. 8 is a schematic diagram of a fifth operation mode according to the disclosure.

Please refer to FIG. 8, which is a schematic diagram of a fifth operation mode according to the disclosure. In the embodiment, in the fifth operation mode, the electronic device receives a power source. The ground pin PGND is grounded. In the fifth operation mode, when the electronic device receives the power source, the control signal SC has a high voltage value VH. The configuration channel pin PCC1 receives the test voltage VD. The switches Q1 and Q2 are turned on in response to the high voltage value VH of the control signal SC. Therefore, the resistance value between the configuration channel pin PCC1 and the ground pin PGND is substantially equal to the resistance value of the pull-down resistor Rd (e.g., 5.1 kΩ).

Figure 9:
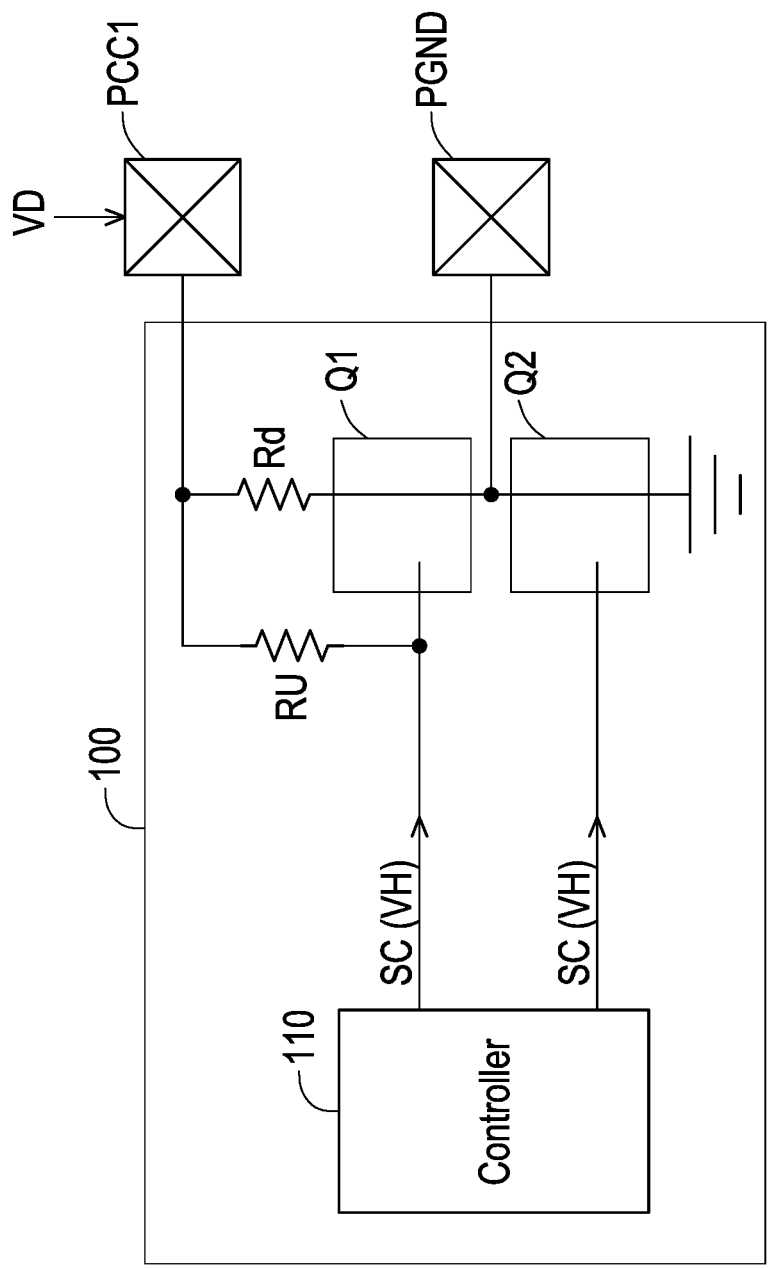
FIG. 9 is a schematic diagram of a sixth operation mode according to the disclosure.

Please refer to FIG. 9, which is a schematic diagram of a sixth operation mode according to the disclosure. In the embodiment, in the sixth operation mode, the electronic device receives a power source. The ground pin PGND is floating. In the sixth operation mode, when the electronic device receives the power source, the control signal SC has a high voltage value VH. The configuration channel pin PCC1 receives the test voltage VD. The switches Q1 and Q2 are turned on in response to the high voltage value VH of the control signal SC. Therefore, the resistance value between the configuration channel pin PCC1 and the ground pin PGND is substantially equal to the resistance value of the pull-down resistor Rd (e.g., 5.1 kΩ).

Based on the fifth operation mode and the sixth operation mode, when the control signal SC has a high voltage value VH, the switches Q1 and Q2 are turned on in response to the high voltage value VH of the control signal SC. This makes the resistance value between the configuration channel pin PCC1 and the ground pin PGND substantially equal to the resistance value of the pull-down resistor Rd.

Referring to the embodiment shown in FIG. 3 again, the testing circuit 100 may operate based on multiple modes as shown in FIGS. 4 to 9. The testing circuit 100 is capable of executing the TD 4.1.2 test item in the compliance test.

For example, in the case where the ground pin PGND is floating, when the electronic device ED does not receive a power source, the control signal SC has a low voltage value VL or a high impedance signal. Therefore, when the electronic device ED does not receive the power source, the resistance value between the configuration channel pin PCC1 and the ground pin PGND is equal to a high impedance value. The above operation may be implemented by the second operation mode as shown in FIG. 5 or the fourth operation mode in FIG. 7. On the other hand, when the electronic device ED receives a power source, the control signal SC has a high voltage value VH. Therefore, when the electronic device ED receives the power source, the resistance value between the configuration channel pin PCC1 and the ground pin PGND is substantially equal to the resistance value of the pull-down resistor Rd (e.g., 5.1 kΩ). The above operation may be implemented by a sixth operation mode as shown in FIG. 9. Based on the above, in the case where the ground pin PGND is floating, when the electronic device ED does not receive a power source, the resistance value of the pull-down resistor Rd may be obtained through the configuration channel pin PCC1. When the electronic device ED receives the power source, the resistance value of the pull-down resistor Rd is not obtained. The testing circuit 100 is capable of executing the TD 4.1.2 test item in the compliance test.

It should be noted that the testing circuit 100 is capable of executing the TD 4.1.2 test item merely by using the configuration channel pin PCC1 and the ground pin PGND. The testing circuit 100 does not need to add an additional pin to, for example, execute the TD 4.1.2 test item. Therefore, the pin design cost of the USB U1 is not increased.

For another example, in the case where the ground pin PGND is grounded, when the electronic device ED does not receive a power source, the control signal SC has a low voltage value VL. Therefore, when the electronic device ED does not receive the power source, the resistance value between the configuration channel pin PCC1 and the ground pin PGND is equal to a high impedance value. The above operation may be implemented by the third operation mode as shown in FIG. 6. On the other hand, when the electronic device ED receives a power source, the control signal SC has a high voltage value VH. Therefore, when the electronic device ED receives the power source, the resistance value between the configuration channel pin PCC1 and the ground pin PGND is substantially equal to the resistance value of the pull-down resistor Rd (e.g., 5.1 kΩ). The above operation may be implemented by the fifth operation mode as shown in FIG. 8. Based on the above, when the ground pin PGND is grounded, the testing circuit 100 is also capable of executing the TD 4.1.2 test item in the compliance test.

Figure 10:
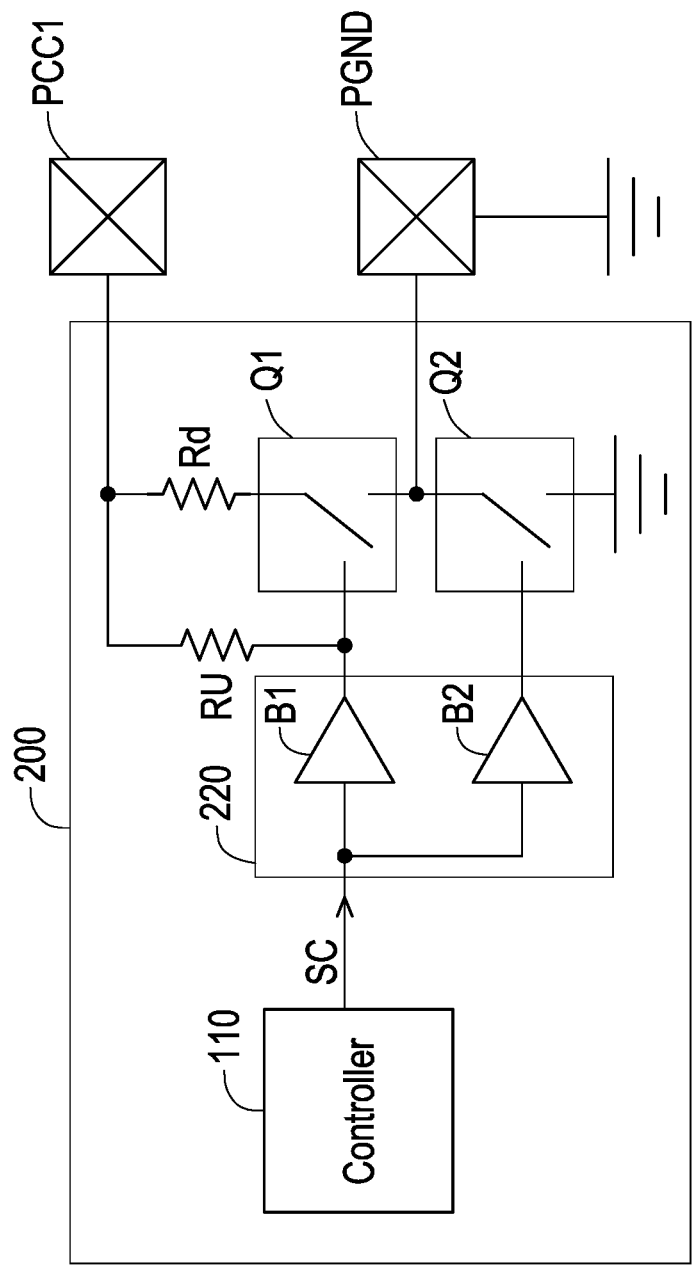
FIG. 10 is a schematic diagram of a testing circuit according to a second embodiment of the disclosure.

Please refer to FIG. 10, which is a schematic diagram of a testing circuit according to a second embodiment of the disclosure. In the embodiment, a testing circuit 200 includes the controller 110, a buffer circuit 220, the switches Q1 and Q2, the pull-down resistor Rd, and the gating pull-up resistor RU. The implementations of the controller 110, the switches Q1 and Q2, the pull-down resistor Rd, the gating pull-up resistor RU, the configuration channel pin PCC1, and the ground pin PGND have been clearly described in the embodiments of FIGS. 3 to 9, so the descriptions are not repeated here. The buffer circuit 220 is coupled to the controller 110. The buffer circuit 220 shifts the voltage level of the control signal SC provided by the controller 110.

For example, when the buffer circuit 220 receives the control signal SC with a high voltage level, the buffer circuit 220 raises the voltage value of the control signal SC to a strong high voltage level. The voltage value of the strong high voltage level is higher than the voltage value of the high voltage level. For another example, when the buffer circuit 220 receives the control signal SC with a low voltage level, the buffer circuit 220 pulls down the voltage value of the control signal SC to a strong low voltage level. The voltage value of the strong low voltage level is lower than the voltage value of the low voltage level. Therefore, the buffer circuit 220 is capable of ensuring that the operation of the switches Q1 and Q2 is correct.

In the embodiment, the buffer circuit 220 includes buffers B1 and B2. An input terminal of the buffer B1 is coupled to the controller 110. An output terminal of the buffer B1 is coupled to the control terminal of the switch Q1. An input terminal of the buffer B2 is coupled to the controller 110. An output terminal of the buffer B2 is coupled to the control terminal of the switch Q2.

When the input terminal of the buffer B1 receives the control signal SC, the buffer B1 shifts the voltage level of the control signal SC, and provides the shifted control signal SC to the control terminal of the switch Q1. When the input terminal of the buffer B2 receives the control signal SC, the buffer B2 shifts the voltage level of the control signal SC, and provides the shifted control signal SC to the control terminal of the switch Q2.

In some embodiments, the buffer circuit 220 may be disposed in the controller 110.

Figure 11:
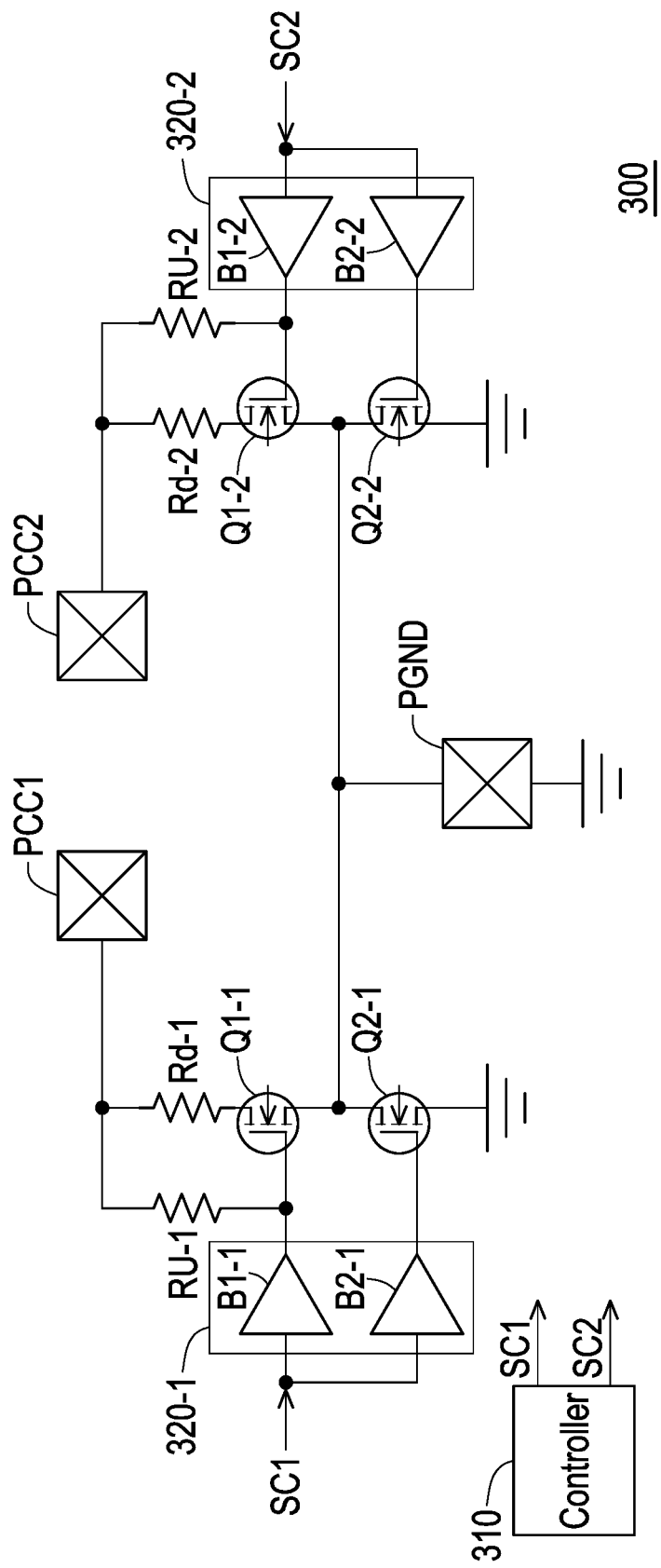
FIG. 11 is a schematic diagram of a testing circuit according to a third embodiment of the disclosure.

Please refer to FIG. 11, which is a schematic diagram of a testing circuit according to a third embodiment of the disclosure. In the embodiment, a testing circuit 300 includes a controller 310, buffer circuits 320-1 and 320-2, switches Q1-1, Q1-2, Q2-1, and Q2-2, pull-down resistors Rd-1, Rd-2, and gating pull-up resistors RU-1 and RU-2. The testing circuit 300 may be applied to the compliance test of the USB-C Multi-Port.

In the embodiment, the switches Q1-1, Q1-2, Q2-1, and Q2-2 are respectively implemented by N-type Metal-Oxide-Semiconductor (MOS) FETs. The disclosure is not limited to the implementations of the switches Q1-1, Q1-2, Q2-1, and Q2-2. The switches Q1-1, Q1-2, Q2-1, and Q2-2 of the disclosure are respectively implemented by N-type FETs or NPN-type BJTs.

The controller 310 provides control signals SC1 and SC2 according to the power receiving condition of the electronic device. An input terminal of the buffer circuit 320-1 is coupled to the controller 310 to receive the control signal SC1. A control terminal of the switch Q1-1 is coupled to an output terminal of the buffer circuit 320-1. The pull-down resistor Rd-1 is coupled between the configuration channel pin PCC1 of the USB and a first terminal of the switch Q1-1. The gating pull-up resistor RU-1 is coupled between the configuration channel pin PCC1 and the control terminal of the switch Q1-1. A control terminal of the switch Q2-1 is coupled to the output terminal of the buffer circuit 320-1. A first terminal of the switch Q2-1 is coupled to a second terminal of the switch Q1-1 and the ground pin PGND of the USB. A second terminal of the switch Q2-1 is coupled to a reference low voltage (such as being grounded).

An input terminal of the buffer circuit 320-2 is coupled to the controller 310 to receive the control signal SC2. A control terminal of the switch Q1-2 is coupled to an output terminal of the buffer circuit 320-2. The pull-down resistor Rd-2 is coupled between a configuration channel pin PCC2 of the USB and a first terminal of the switch Q1-2. The gating pull-up resistor RU-2 is coupled between the configuration channel pin PCC2 and the control terminal of the switch Q1-2. A control terminal of the switch Q2-2 is coupled to the output terminal of the buffer circuit 320-2. A first terminal of the switch Q2-2 is coupled to a second terminal of the switch Q1-2 and the ground pin PGND of the USB. A second terminal of the switch Q2-2 is coupled to a reference low voltage.

In the embodiment, the controller 310, the switches Q1-1 and Q2-1, the pull-down resistor Rd-1, and the gating pull-up resistor RU-1 may be configured for the compliance test (e.g., the TD 4.1.2 test item) between the configuration channel pin PCC1 and the ground pin PGND. The controller 310, the switches Q1-2 and Q2-2, the pull-down resistor Rd-2, and the gating pull-up resistor RU-2 may be configured for the compliance test (e.g., the TD 4.1.2 test item) between the configuration channel pin PCC2 and the ground pin PGND. The above-mentioned compliance test may be implemented by multiple operation modes shown in FIGS. 4 to 9, so the descriptions are not repeated here.

It should be noted that, in the embodiment, the testing circuit 300 merely uses the configuration channel pins PCC1 and PCC2 and the ground pin PGND to execute the multi-port compliance test. In light of the above, when the number of ports in the multi-port is equal to N, the testing circuit 300 merely needs (N+1) pins to execute the multi-port compliance test.

In the embodiment, when the buffer circuit 320-1 receives the control signal SC1 with a high voltage level, the buffer circuit 320-1 raises the voltage value of the control signal SC1 to a strong high voltage level. The voltage value of the strong high voltage level is higher than the voltage value of the high voltage level. For another example, when the buffer circuit 320-1 receives the control signal SC1 with a low voltage level, the buffer circuit 320-1 pulls down the voltage value of the control signal SC1 to a strong low voltage level. The voltage value of the strong low voltage level is lower than the voltage value of the low voltage level.

When the buffer circuit 320-2 receives the control signal SC2 with a high voltage level, the buffer circuit 320-2 raises the voltage value of the control signal SC2 to a strong high voltage level. The voltage value of the strong high voltage level is higher than the voltage value of the high voltage level. For another example, when the buffer circuit 320-2 receives the control signal SC2 with a low voltage level, the buffer circuit 320-2 pulls down the voltage value of the control signal SC2 to a strong low voltage level. The voltage value of the strong low voltage level is lower than the voltage value of the low voltage level.

In the embodiment, the buffer circuit 320-1 includes buffers B1-1 and B2-1. When an input terminal of the buffer B1-1 receives the control signal SC1, the buffer B1-1 shifts the voltage level of the control signal SC1, and provides the shifted control signal SC1 to the control terminal of the switch Q1-1. When an input terminal of the buffer B2-1 receives the control signal SC1, the buffer B2-1 shifts the voltage level of the control signal SC1, and provides the shifted control signal SC1 to the control terminal of the switch Q2-1.

The buffer circuit 320-2 includes buffers B1-2 and B2-2. When an input terminal of the buffer B1-2 receives the control signal SC2, the buffer B1-2 shifts the voltage level of the control signal SC2, and provides the shifted control signal SC2 to the control terminal of the switch Q1-2. When an input terminal of the buffer B2-2 receives the control signal SC2, the buffer B2-2 shifts the voltage level of the control signal SC2, and provides the shifted control signal SC2 to the control terminal of the switch Q2-2.

To sum up, the testing circuit of the disclosure utilizes the configuration channel pin of the USB and the ground pin of the USB to execute the compliance test. The testing circuit does not need to add an additional pin to execute the compliance test. In this way, the pin design cost of the USB is not increased.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. A testing circuit, configured to test a universal serial bus (USB) of an electronic device, wherein the testing circuit comprises:
   a controller, configured to provide a control signal according to a power receiving condition of the electronic device;
   a first switch, and a control terminal of the first switch being coupled to the controller;

a pull-down resistor, coupled between a configuration channel pin of the USB and a first terminal of the first switch;

a gating pull-up resistor, coupled between the configuration channel pin and the control terminal of the first switch; and a second switch, a control terminal of the second switch being coupled to the controller, a first terminal of the second switch being coupled to a second terminal of the first switch and a ground pin of the USB, and a second terminal of the second switch being coupled to a reference low voltage.

2. The testing circuit according to claim 1, wherein when the electronic device does not receive a power source, the control signal is a high impedance signal.

3. The testing circuit according to claim 2, wherein:
when the ground pin is grounded, the configuration channel pin receives a test voltage,
the first switch is turned on in response to the test voltage, and
a resistance value between the configuration channel pin and the ground pin is substantially equal to a resistance value of the pull-down resistor.

4. The testing circuit according to claim 2, wherein:
when the ground pin is floating, the configuration channel pin receives a test voltage,
the first switch is turned off, and
a resistance value between the configuration channel pin and the ground pin is equal to a high impedance value.

5. A testing circuit according to claim 1, wherein when the control signal has a low voltage value, the first switch and the second switch are turned off in response to the low voltage value, and a resistance value between the configuration channel pin and the ground pin is equal to a high impedance value.

6. The testing circuit according to claim 5, wherein when the electronic device does not receive the power source, the control signal has the low voltage value.

7. The testing circuit according to claim 1, wherein when the electronic device receives a power source, the control signal has a high voltage value, the first switch and the second switch are turned on in response to the high voltage value, and a resistance value between the configuration channel pin and the ground pin is substantially equal to a resistance value of the pull-down resistor.

8. The testing circuit according to claim 1, wherein the first switch and the second switch are transistor switches.

9. The testing circuit according to claim 1, further comprising:
a buffer circuit, coupled to the controller and configured to shift a voltage level of the control signal.

10. The testing circuit according to claim 9, wherein the buffer circuit comprises:
a first buffer, an input terminal of the first buffer being coupled to the controller, and an output terminal of the first buffer being coupled to the control terminal of the first switch; and
a second buffer, an input terminal of the second buffer being coupled to the controller, and an output terminal of the second buffer being coupled to the control terminal of the second switch.

* * * * *